(12) United States Patent
Toyoda et al.

(10) Patent No.: US 10,994,676 B2
(45) Date of Patent: May 4, 2021

(54) ELECTRIC CONNECTION BOX

(71) Applicant: YAZAKI CORPORATION, Tokyo (JP)

(72) Inventors: Ryoma Toyoda, Makinohara (JP);
Kunihiko Yamada, Makinohara (JP);
Terumitsu Sugimoto, Makinohara (JP);
Masashi Suzuki, Makinohara (JP);
Kenichi Katsumata, Makinohara (JP);
Jun Goto, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/931,527

(22) Filed: May 13, 2020

(65) Prior Publication Data

US 2020/0391680 A1    Dec. 17, 2020

(30) Foreign Application Priority Data

Jun. 14, 2019  (JP) .............................. JP2019-111213

(51) Int. Cl.
*H01R 12/00* (2006.01)
*B60R 16/023* (2006.01)
*H05K 7/02* (2006.01)

(52) U.S. Cl.
CPC ...... *B60R 16/0238* (2013.01); *B60R 16/0239* (2013.01); *H05K 7/026* (2013.01)

(58) Field of Classification Search
CPC .. B60R 16/0238; B60R 16/0239; H05K 7/02; H05K 7/026; H01R 12/00; H01R 12/50
USPC ................................................ 439/76.1, 76.2
See application file for complete search history.

(56) References Cited

U.S. PATENT DOCUMENTS

| 2012/0043808 A1 | 2/2012 | Berkhahn et al. |
| 2015/0372975 A1 | 12/2015 | Moriya et al. |
| 2020/0391680 A1* | 12/2020 | Toyoda ............... B60R 16/0231 |

FOREIGN PATENT DOCUMENTS

| EP | 3 476 661 A1 | 5/2019 |
| FR | 2 996 938 A1 | 4/2014 |
| FR | 3 073 099 A1 | 5/2019 |
| JP | 2014-165641 A | 9/2014 |

* cited by examiner

*Primary Examiner* — Khiem M Nguyen
(74) *Attorney, Agent, or Firm* — Kenealy Vaidya LLP

(57) ABSTRACT

An electric connection box includes: the housing, or a plurality of communication connectors provided therein; a communication switch circuit, which is provided inside the housing, has a communication relay function and controls a communication path between the plurality of communication connectors; and a common power supply circuit, which is provided inside the housing and capable of supplying common power generated based on the power from the input side power supply line to a plurality of electric circuits including the communication switch circuit.

4 Claims, 8 Drawing Sheets

ELECTRIC CONNECTION BOX

CROSS REFERENCE TO RELATED APPLICATIONS

This application is based on and claims priority from Japanese patent application No. 2019-111213 filed on Jun. 14, 2019, the entire contents of which are incorporated herein by reference.

BACKGROUND OF THE INVENTION

1. Technical Field

The present invention relates to an electric connection box which can be used for electric connection configured to supply power supply power to various loads in a vehicle or the like.

2. Background Art

A vehicle, such as an automobile, generally includes an in-vehicle battery as a main power supply. Moreover, an alternator (generator) is provided to charge the in-vehicle battery. DC power supply power is supplied from the main power supply to a large number of various electric components, that is, loads placed in each portion of the vehicle. Each load in the vehicle is used to perform various functions, such as traveling, steering, stopping, opening and closing of doors, lighting, and communication of the vehicle at all times or as needed, and thus requires supply of the power supply power.

In order to supply the power supply power mainly from the main power supply to each electric component on the vehicle, the main power supply and each electric component are electrically connected via a wire harness. The wire harness is basically an aggregate of a large number of electric wires, and generally has a very complicated shape and structure.

In order to distribute the power supply power from the main power supply to a plurality of output side paths, to control on and off of power supply to each load, and to protect the power supply and each load, an electric connection box is generally connected to an intermediate portion of the wire harness. A junction block (JIB), a relay box (RIB), and the like are known as typical electric connection boxes.

In recent vehicles, it is necessary to transmit signals and data between a large number of electronic control units (ECUs), switches, sensors, and the like placed on various locations on the vehicles. Therefore, various communication lines used for transmitting the signals and data are often incorporated in the same wire harness.

Patent Literature JP-A-2014-165641 discloses an example of information transmission on a vehicle. In a configuration shown in FIG. 3 of Patent Literature JP-A-2014-165641, as described in paragraph [0053], an information system bus 20 includes a communication bus 21 conforming to the Ethernet (registered trademark) standard, and is connected to a DMZ 60 via the communication bus 21 so as to be able to communicate with the DMZ 60 by IP. The communication bus 21 is connected to an ECU 211 and two ECUs 213, 214 via an Ethernet switch 212. The Ethernet switch 212 is a switching hub and distributes a communication message input via the communication bus 21 from the DMZ 60 to the ECU (213 or 214), which is a transmission destination of the communication message.

SUMMARY

For example, in consideration of mounting an automatic driving function or the like on a vehicle, it is assumed that the Ethernet is used or a switching hub is provided, as shown in Patent Literature 1, so as to enable transmission of various types of information on the vehicle.

However, in a case where a signal of a light detection and ranging (LiDAR) sensor provided at a tip end portion or the like of a vehicle is transmitted by using the Ethernet to reach the vicinity of a center of a vehicle body, for example, since a distance thereof is long and problems such as signal attenuation are likely to occur, it is necessary to interpose a relay connector in the middle of the wire harness Therefore, a structure of the wire harness is complicated.

The switching hub requires power supply power with a stable voltage, so a power supply circuit must be provided and thus miniaturization is difficult. For example, when the signal of the LiDAR sensor provided at the tip end portion of the vehicle is drawn into a vehicle interior side via an engine room, a waterproof function must be provided at locations where the wiring harness for transmitting the signal passes through partition walls of the engine room. Further, when performance of the LiDAR sensor increases or the number of the LiDAR sensors increases, through holes must be expanded as an outer diameter of the wire harness which passes through the partition walls increases, and vibration, sound, or the like in the engine room is likely to be transmitted into the vehicle interior.

The present invention has been made in view of the above circumstances, and an object thereof is to provide an electric connection box which is capable of preventing the structure of the wire harness from becoming complicated and preventing an increase in the number of components even in a vehicle having a high function by mounting an automatic driving function or the like.

In order to achieve the above object, the electric connection box according to the present invention is characterized by the following (1) to (4).

(1) An electric connection box, wherein at least a power distribution circuit, which is configured to distribute power supply power supplied from an input side power supply line to a plurality of output side power supply lines, and/or an electric component, which is configured to perform a predetermined function with respect to the power supply power, are provided in a predetermined housing,
the electric connection box comprising:
a plurality of communication connectors provided on or in the housing;
a communication switch circuit, which is provided inside the housing, has a communication relay function and controls a communication path between the plurality of communication connectors; and
a common power supply circuit, which is provided inside the housing and capable of supplying common power generated based on the power from the input side power supply line to a plurality of electric circuits including the communication switch circuit.

(2) The electric connection box according to above (1), wherein a plurality of output side power connectors, which are connectable to a plurality of power cables each having a different cabling path, are provided on or in the housing, and
the plurality of communication connectors are respectively provided at positions adjacent to or close to the plurality of output side power connectors.

(3) The electric connection box according to above (1), wherein at least a portion of the housing is provided in a state of being exposed in an engine room of a vehicle, and a portion of the plurality of communication connectors are provided in a state of being exposed in the engine room.

(4) The electric connection box according to above (3), wherein the housing has a waterproof function, and the communication switch circuit and the common power supply circuit share the waterproof function of the housing with the electric component.

According to the electric connection box having the above configuration (1), since the communication switch circuit incorporated therein controls the communication path between the plurality of communication connectors, it is not necessary to connect a switching hub to an outer side. That is, the number of electric wire or the like for connecting the electric connection box and the switching hub can be reduced. Moreover, since the common power supply circuit incorporated in the housing can supply the power supply power to the plurality of electric circuits including the communication switch circuit in common, the number of components can be reduced and an overall size of the device can be reduced as compared with a case where the switching hub is connected to the outer side of the electric connection box.

According to the electric connection box having the above configuration (2), since the output side power connector and the communication connector are provided at the positions adjacent to each other or close to each other, it becomes easy to arrange electric wires of power cables and electric wires of communication cables, which constitute a wire harness, side by side. That is, when wiring the wire harness, it is easier to configure the power cables and communication cables having a common wiring destination to pass through a common path, and thus complication of structure and shape thereof can be avoided. Further, it is easier to attach and detach the connectors to and from each other. Moreover, since the communication switch circuit has the communication relay function, when a distance between the electric connection box and a LiDAR sensor is small, the number of relay connectors can be reduced.

According to the electric connection box having the above configuration (3), since the communication switch circuit incorporated therein controls the communication path between the plurality of communication connectors, it is possible to avoid an increase in an outer diameter of the wire harness at locations where electric wires of communication cables passes through partition walls of an engine room. Therefore, it is not necessary to expand through holes, and vibration, sound, and the like in the engine room can be restrained from being transmitted to the vehicle interior. Moreover, since the communication switch circuit has the communication relay function, when the distance between the electric connection box and the LiDAR sensor is small, the number of relay connectors can be reduced.

According to the electric connection box having the above configuration (4), since the electric component, the communication switch circuit, and the common power supply circuit share the waterproof function of the housing, it is not necessary to newly add a special waterproof function. Therefore, it is possible to reduce the number of components and a size of the entire device.

According to the electric connection box of the present invention, the structure of the wire harness can be preventing from becoming complicated and the increase in the number of components can be prevented even in the vehicle having the high function by mounting the automatic driving function or the like. That is, since the number of switching hubs connected to the outer side of the electric connection box can be reduced, the number of electric wires and the like connecting therebetween can also be reduced. Moreover, since the common power supply circuit incorporated in the housing can supply the power supply power to the plurality of electric circuits including the communication switch circuit in common, the number of components can be reduced and the overall size of the device can be reduced as compared with the case where the switching hub is connected to the outer side of the electric connection box.

The present invention has been briefly described above. Details of the present invention will be further clarified by reading a mode (hereinafter, referred to as "embodiment") for carrying out the present invention described below with reference to the accompanying drawings.

DETAILED DESCRIPTION OF EMBODIMENTS

A specific embodiment of the present invention will be described below with reference to the drawings.

<Outline 1 of Layout on Vehicle>

Figure 1:
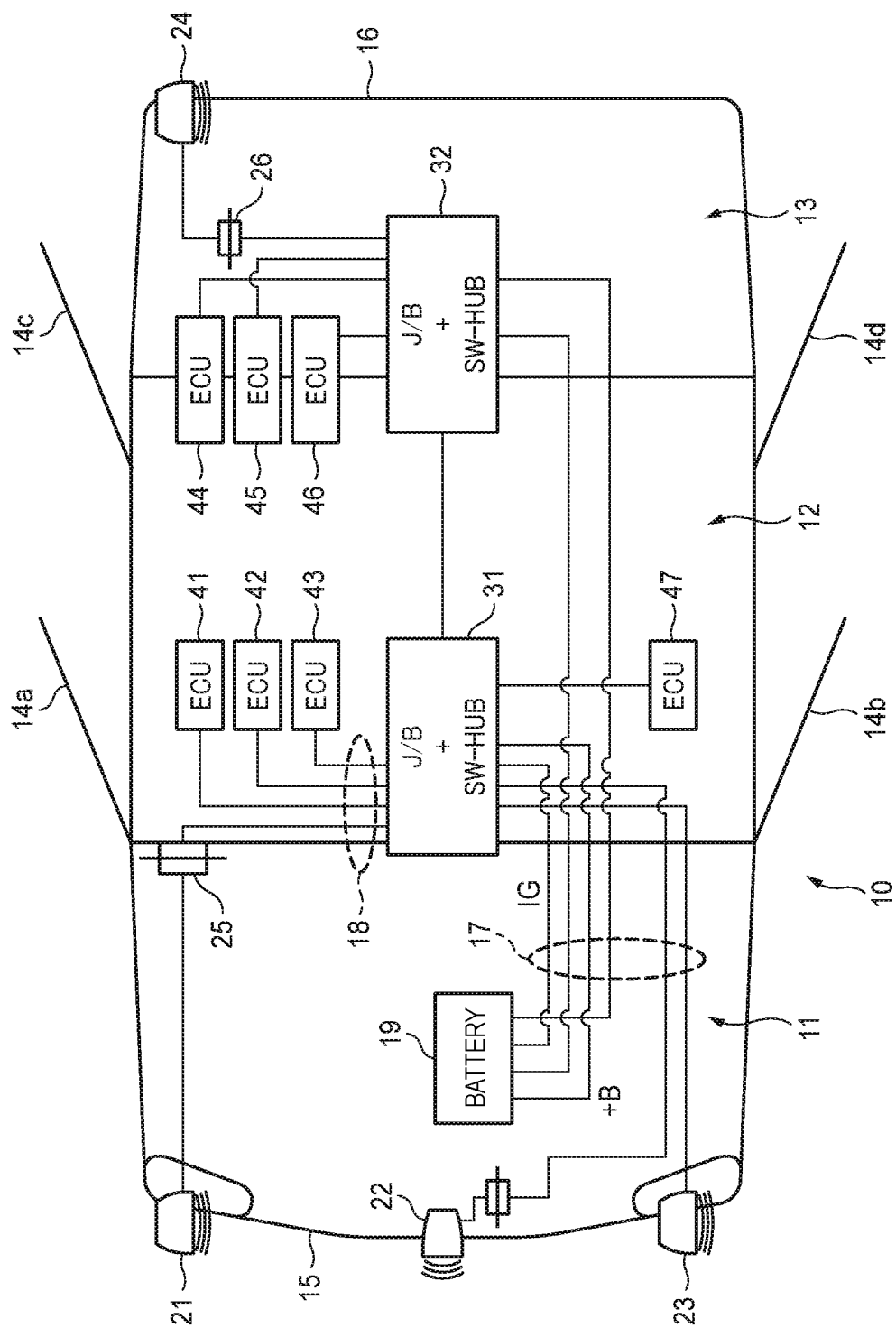
FIG. 1 is a plan view showing a layout outline of main components on a vehicle equipped with an electric connection box configured as a JB switch box.

FIG. 1 is a plan view showing a layout outline of main components on a vehicle 10 equipped with an electric connection box configured as JB switch boxes 31, 32. FIG. 1 is a plan view of main components on the vehicle 10 as viewed from above, A left side of the figure represents a front side of the vehicle while a right side represents a rear side.

As shown in FIG. 1, an interior of the vehicle 10 is roughly divided into three compartments including: an engine room 11, a vehicle compartment 12, and a luggage compartment 13. An in-vehicle battery 19, which serves as a main power supply, is provided in the engine room 11. Power supply power (+B: power supply of, for example, a DC voltage of 12 [V]) is supplied from the in-vehicle battery 19 in the engine room 11 to various electric components on the vehicle 10 via wire harnesses 17, 18. Moreover, a power supply line, which is linked to on and off of an ignition (IG), is also connected to each electric component.

In the example shown in FIG. 1, the JB switch boxes 31 and 32 are connected in the middle of paths of the wire harnesses 17, 18. Each of the JB switch boxes 31 and 32 basically integrates a function of a junction block (J/B), which is a common component, and a function of an Ethernet communication switching hub, and is accommodated in one housing.

Therefore, communication lines can also be connected to the JB switch boxes 31 and 32 in addition to power supply lines of the wire harnesses 17, 18. Moreover, since the function of the junction block and the function of the switching hub are integrated in the one housing, power supply lines connecting such components are not required in the wire harnesses 17, 18.

In the present embodiment, the vehicle 10 is provided with light detection and ranging (LiDAR) devices 21, 22, 23, and 24 at a right end, a center and a left end of a vehicle body front portion 15, and a right end of a vehicle body rear portion 16, so as to correspond to an automatic driving function.

Power supply lines and communication lines of the LiDAR devices 22, 23 pass through partition walls of the engine room 11 and the vehicle compartment 12 together with the wire harness 17 so as to straddle between floors of the engine room 11 and the vehicle compartment 12, and are connected to the JB switch box 31. Power supply lines and communication lines of the LiDAR device 21 pass through the partition walls of the engine room 11 and the vehicle compartment 12 together with the wire harness 18 so as to straddle between the floors of the engine room 11 and the vehicle compartment 12, and are connected to the JB switch box 31. Moreover, a relay connector 25 is connected in the middle of the wire harness 18 to relay Ethernet communication.

The power supply lines and the communication lines of the LiDAR device 24 are connected to the JB switch box 32 via a relay connector 26.

The vehicle 10 is mounted with various electric components 41 to 47. The electric components 41 to 47 have configurations and functions such as a dedicated communication device (DCM: Data Communication Module), a meter unit, a central gateway, an ADX, an electronic control unit of an automatic driving system (ADS), an electronic control unit of an SIS, and a data link connector (DLC). The central gateway performs data and protocol conversion between a plurality of networks (such as CANs) on the vehicle 10, and serves as a center of vehicle information management.

In the example of FIG. 1, the JB switch box 31 is provided on a front side in the vehicle compartment 12, and the JB switch box 32 is provided on a rear side in the vehicle compartment 12. Therefore, the electric components 41, 42, 43, and 47, which are located in the vicinity of an instrument panel, are connected to the JB switch box 31. The electric components 44, 45, and 46, which are provided in the luggage compartment 13, are connected to the JB switch box 32.

In a case where the LiDAR devices 22, 23 are connected by an Ethernet communication line, an influence of signal attenuation or the like is increased when a distance of the communication line is long, so it is necessary to connect a relay connector in the middle of the communication line. However, in the example shown in FIG. 1, since the function of a switching hub, which has a function of relaying Ethernet communication, is included in the JB switch box 31, when a distance between a position where the JB switch box 31 is provided and the LiDAR devices 22, 23 is not large, the relay connector therebetween can be omitted. Since a distance to the JB switch box 31 is large, the relay connector 25 is connected in the middle of the wire harness 18 which connects the LiDAR device 21.

In the example shown in FIG. 1, in the wire harness 17, a +B power supply line for connecting the in-vehicle battery 19 and the JB switch box 31 and a +B power supply line connecting the in-vehicle battery 19 and the JB switch box 32 are each connected in an independent state. Moreover, although not shown, fuses are individually inserted into such power supply lines. Therefore, even in a case where the fuse of one power supply line is broken due to occurrence of an abnormality, and power supply and Ethernet communication functions of one of the two JB switch boxes 31, 32 do not work, paths of the power supply and the Ethernet communication can be ensured by using functions of the other JB switch box.

Configuration Example 1 of JB Switch Box 31

Figure 2A:
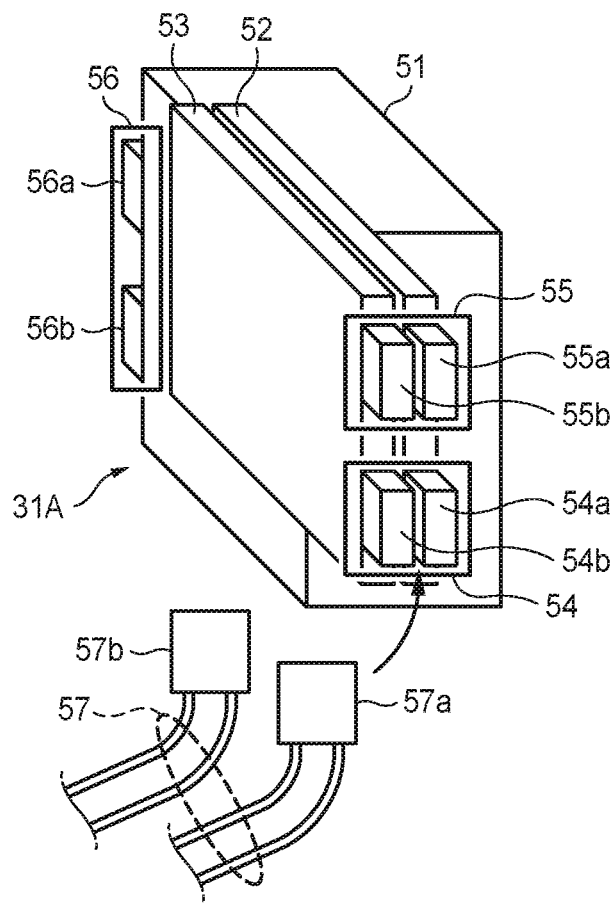
FIG. 2A is a perspective view showing a layout of main components in a configuration example 1 of the JB switch box.
Figure 2B:
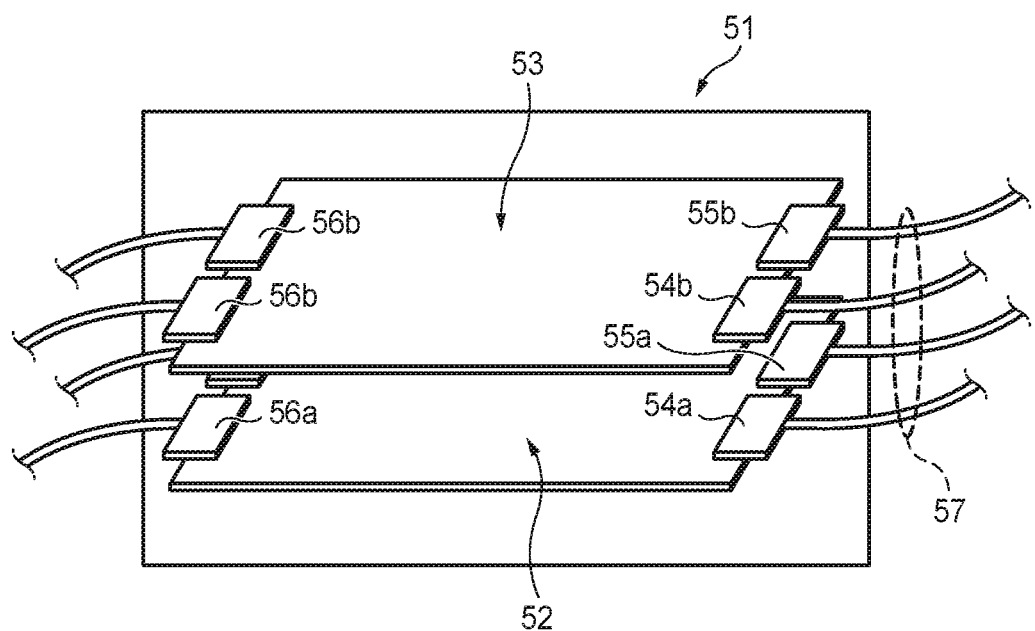
FIG. 2B is a perspective view showing a layout of components incorporated in a housing of the JB switch box of FIG. 2A.

FIG. 2A is a perspective view showing a layout of main components in a configuration example 1 of the JB switch box 31, and FIG. 2B is a perspective view showing a layout of components incorporated in a housing of a JB switch box 31A of FIG. 2A. A configuration of the JB switch box 32 is also the same as that of the JB switch box 31A.

As shown in FIG. 2A, the JB switch box 31A includes a housing 51 which forms a hollow box having a rectangular parallelepiped outer shape. Moreover, a circuit substrate, which includes a JB functional unit 52 and a switching hub functional unit 53, is accommodated in the housing 51.

An engine compartment (that is, the engine room 11) connection portion 54 and a floor connection portion 55 are provided on a front surface side of the housing 51 at two positions, upper and lower. Moreover, an instrument panel connection portion 56 is provided on a back surface side of the housing 51.

The engine compartment connection portion 54 is used to connect a portion of a sub harness constituting a wire harness 57 where a wiring destination is divided into the engine room 11. Moreover, the floor connection portion 55 is used to connect a portion of the sub harness constituting the wire harness 57 where the wiring destination is divided into a floor region in the vehicle compartment 12. Moreover, the instrument panel connection portion 56 is used to connect a portion of the sub harness constituting the wire harness 57 where the wiring destination is divided into an instrument panel region in the vehicle compartment 12.

The engine compartment connection portion 54 includes a power system connector 54a and a communication system connector 54b. The floor connection portion 55 includes a power system connector 55a and a communication system connector 55b. The instrument panel connection portion 56 includes a power system connector 56a and a communication system connector 56b.

Each of the communication system connectors 54b, 55b and 56b on the JB switch box 31A is connected to a communication system connector 57b which is connected to an Ethernet communication line in the sub harness constituting the wire harness 57. Moreover, each of the power system connectors 54a, 55a and 56a on the JB switch box 31A is connected to a power system connector 57a which is connected to electric wires other than the Ethernet communication line in the sub harness constituting the wire harness 57.

As shown in FIG. 2A, wiring of the wire harness 57 can be facilitated by arranging the power system connector 54a and the communication system connector 54b to be adjacent to each other in the same engine compartment connection portion 54. That is, the two connectors (57a, 57b) of the power system and Ethernet communication system sub harnesses, which are wired along a substantially common path from the inside of the engine room 11 to an installation position of the JB switch box 31A, can be routed together and fitted to the power system connector 54a and the communication system connector 54b at the same location.

Similarly, the two connectors (57a, 57b) of the sub harnesses, which are wired along a substantially common path from the floor region in the vehicle compartment 12 to the installation position of the JB switch box 31A, can be routed together and fitted to the power system connector 55a and the communication system connector 55b at the same location. Moreover, the two connectors (57a, 57b) of the sub harnesses, which are wired along a substantially common path from the vicinity of the instrument panel in the vehicle compartment 12 to the installation position of the JB switch box 31A, can be routed together and fitted to the power system connector 56a and the communication system connector 56b at the same location.

As shown in FIG. 2B, in this example, the circuit substrate which accommodates the switching hub functional unit 53 and the circuit substrate which accommodates the JB functional unit 52 are independent. Moreover, the two circuit substrates are arranged in a state of being overlapped with a certain interval in a thickness direction.

The power system connectors 54a and 55a are provided on one end side of the circuit substrate including the JB functional unit 52, and the power system connector 56a is provided on the other end side. Moreover, the communication system connectors 54b and 55b are provided on one end side of the circuit substrate including the switching hub functional unit 53, and the communication system connector 56b is provided on the other end side. Therefore, the power system connectors 54a, 55a, and 56a, and the communication system connectors 54b, 55b, and 56b can be disposed in proximity to each other at the respective positions of the engine compartment connection portion 54, the floor connection portion 55, and the instrument panel connection portion 56. In particular, when the two circuit substrates are used as shown in FIG. 2B, distances between the power system connectors 54a, 55a, 56a and the communication system connectors 54b, 55b, 56b can be reduced.

For example, there are a large number of cases where a power system sub harness and an Ethernet communication sub harness are wired in substantially the same direction on the same path, which is started from the JB switch box 31 and extends toward the engine compartment, in the wire harnesses 17, 18 connected to the JB switch box 31 as shown in FIG. 1. Therefore, workability of electric wire routing and connector connection during the wiring of the wire harness can be improved by arranging the power system connector 54a and the communication system connector 54b at the adjacent positions.

Similarly, there are a large number of cases where the power system sub harness and the Ethernet communication sub harness are also wired in substantially the same direction on the same path which is started from the JB switch box 31 and extends toward the floor. Therefore, the workability of the electric wire routing and the connector connection during the wiring of the wire harness can be improved by arranging the power system connector 55a and the communication system connector 55b at the adjacent positions. Similarly, the workability of the electric wire routing and the connector connection during the wiring of the wire harness can be improved by arranging the power system connector 56a and the communication system connector 56b at the adjacent positions.

For example, in the configuration of FIG. 2A, if the power system connector 54a and the communication system connector 54b of the engine compartment connection portion 54 are physically connected in advance, frontages thereof can be integrated into one. In this case, an operation of attaching and detaching the power system connector 57a and the communication system connector 57b to and from the engine compartment connection portion 54 of the JB switch box 31A can be completed by a single operation. The floor connection portion 55 and the instrument panel connection portion 56 can also be integrated in the same manner.

Configuration Example 2 of JB Switch Box 31

Figure 3A:
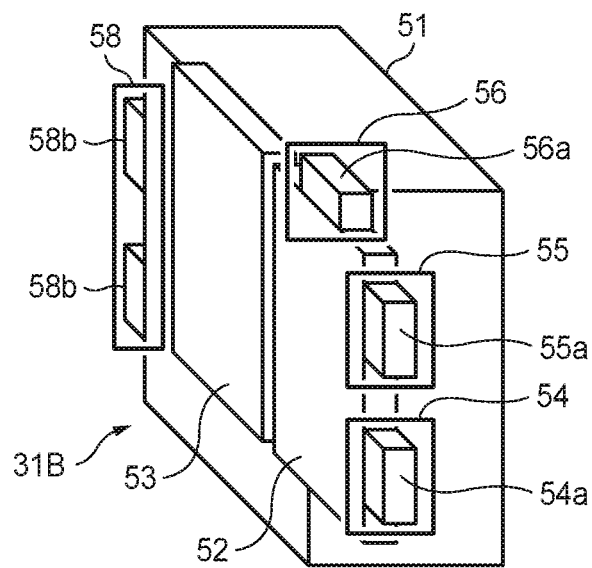
FIG. 3A is a perspective view showing a layout of main components in a configuration example 2 of the JB switch box.
Figure 3B:
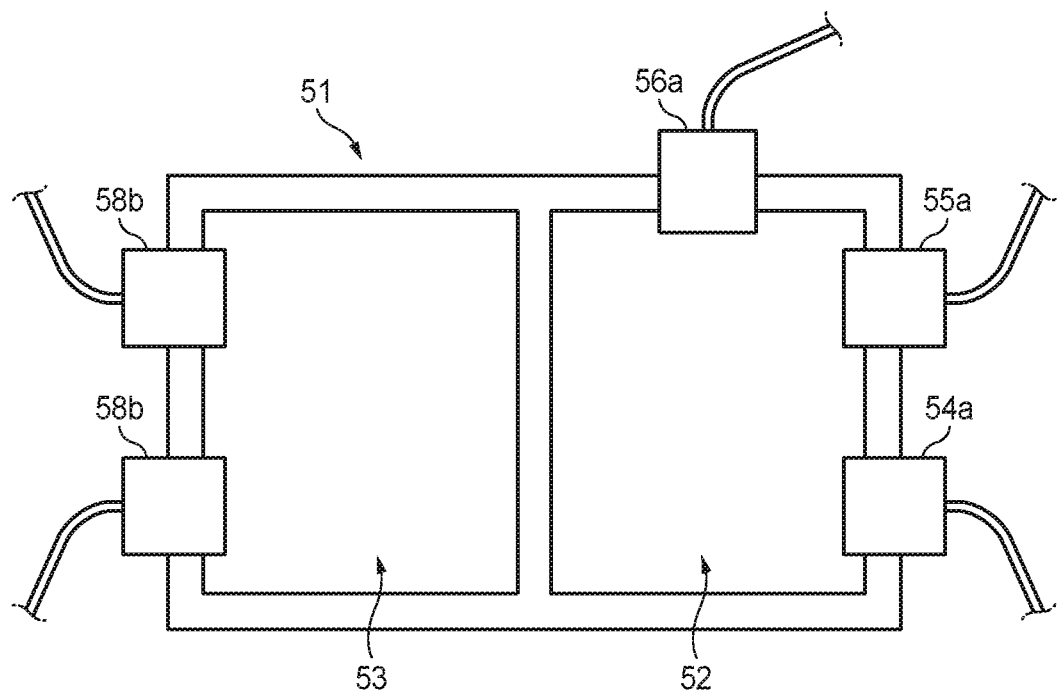
FIG. 3B is a perspective view showing a layout of components incorporated in a housing of the JB switch box of FIG. 3A.

FIG. 3A is a perspective view showing a layout of main components in a configuration example 2 of the JB switch box 31, and FIG. 3B is a perspective view showing a layout of components incorporated in a housing of a JB switch box 31B of FIG. 3A.

As shown in FIG. 3A, the JB switch box 31B includes the housing 51 which forms the hollow box having the rectangular parallelepiped outer shape. Moreover, one single circuit substrate, which includes the JB functional unit 52 and the switching hub functional unit 53, is accommodated in the housing 51.

The engine compartment connection portion 54 and the floor connection portion 55 are provided on the front surface side of the housing 51 at the two positions, upper and lower. The instrument panel connection portion 56 is provided on an upper surface side of the housing 51, and a communication dedicated connection portion 58 is provided on the back surface side of the housing 51.

The engine compartment connection portion 54 is used to connect the portion of the sub harness constituting the wire harness 57 where the wiring destination is divided into the engine room 11. Moreover, the floor connection portion 55 is used to connect the portion of the sub harness constituting the wire harness 57 where the wiring destination is divided into the floor region in the vehicle compartment 12. Moreover, the instrument panel connection portion 56 is used to connect the portion of the sub harness constituting the wire harness 57 where the wiring destination is divided into the instrument panel region in the vehicle compartment 12.

As shown in FIG. 3A, the engine compartment connection portion 54 includes the power system connector 54a, The floor connection portion 55 includes the power system connector 55a. The instrument panel connection portion 56 includes the power system connector 56a, Moreover, the communication dedicated connection portion 58 includes a plurality of communication system connectors 58b which can each correspond to a sub harness of any wiring path.

Therefore, during wiring of the wire harness 57 connected to the JB switch box 31B, an Ethernet communication sub harness and other sub harnesses can be operated separately. Moreover, as shown in FIG. 3A, by arranging the engine compartment connection portion 54, the floor connection portion 55, and the instrument panel connection portion 56 separately at different positions, the sub harnesses of the wire harness 57 whose wiring paths are different can be divided and operated for each path.

As shown in FIG. 3B, in this example, a location where the switching hub functional unit 53 is accommodated and a location where the JB functional unit 52 is accommodated are included in the one single circuit substrate. Moreover, as shown in FIG. 3A, the location where the switching hub functional unit 53 is accommodated is provided on a side close to a back surface of the housing 51, and the location where the JB functional unit 52 is accommodated is provided on a side close to a front surface of the housing 51.

By accommodating the JB functional unit 52 and the switching hub functional unit 53 in the one single circuit substrate in this way, countermeasures against electromagnetic compatibility (EMC) are facilitated. That is, electromagnetic wave interference can be easily eliminated simply by providing a shield plate (not shown) on the one single circuit substrate in an overlapping state.

As shown in FIG. 3B, the power system connectors 54a, 55a, and 56a are provided on a right side and an upper side of the circuit substrate including the JB functional unit 52. Moreover, the communication system connectors 58b are provided on a left end side of the circuit substrate including the switching hub functional unit 53. Therefore, connection positions of the sub harnesses, whose wiring paths or types are different from each other, can be divided into four locations including: the engine compartment connection portion 54, the floor connection portion 55, the instrument panel connection portion 56, and the communication dedicated connection portion 58. Moreover, in the example of FIG. 3B, it is easy to understand that the region of the switching hub functional unit 53, which requires EMC countermeasures, is provided on the left end side of the substrate, so that sufficient EMC countermeasures can be realized simply by using one relatively small shield plate.

Configuration Example 3 of JB Switch Box 31

Figure 4A:
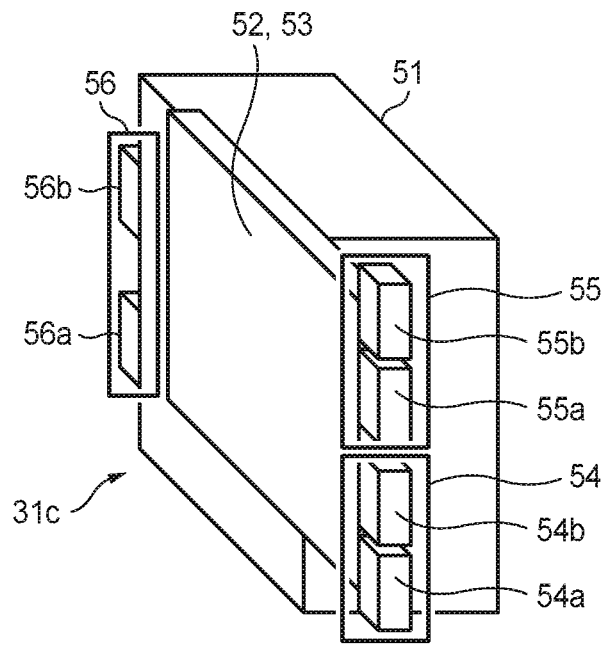
FIG. 4A is a perspective view showing a layout of main components in a configuration example 3 of the JB switch box.
Figure 4B:
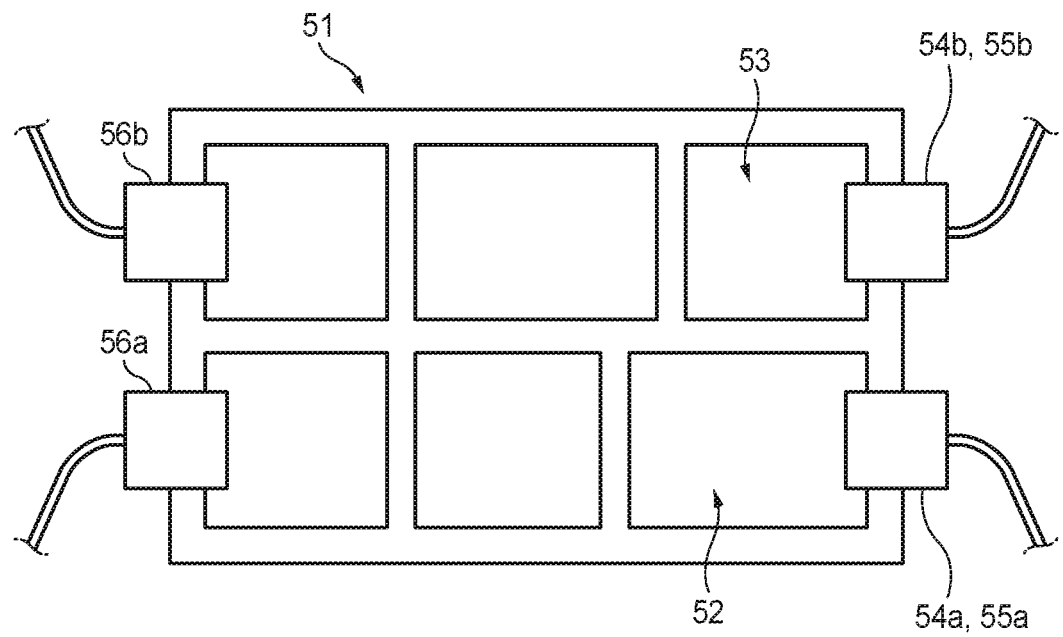
FIG. 4B is a perspective view showing a layout of components incorporated in a housing of the JB switch box of FIG. 4A.

FIG. 4A is a perspective view showing a layout of main components in a configuration example 3 of the JB switch box 31, and FIG. 4B is a perspective view showing a layout of components incorporated in a housing of a JB switch box 310 of FIG. 4A.

As shown in FIG. 4A, the JB switch box 31C includes the housing 51 which forms the hollow box having the rectangular parallelepiped outer shape. Moreover, the circuit substrate, which includes the JB functional unit 52 and the switching hub functional unit 53, is accommodated in the housing 51. The engine compartment connection portion 54 and the floor connection portion 55 are provided on the front surface side of the housing 51 at the two positions, upper and lower.

Moreover, the instrument panel connection portion 56 is provided on the back surface side of the housing 51.

The engine compartment connection portion 54 is used to connect the portion of the sub harness constituting the wire harness 57 where the wiring destination is divided into the engine room 11. Moreover, the floor connection portion 55 is used to connect the portion of the sub harness constituting the wire harness 57 where the wiring destination is divided into the floor region in the vehicle compartment 12. Moreover, the instrument panel connection portion 56 is used to connect the portion of the sub harness constituting the wire harness 57 where the wiring destination is divided into the instrument panel region in the vehicle compartment 12.

The engine compartment connection portion 54 includes the power system connector 54a and the communication system connector 54b which are adjacent to each other. The floor connection portion 55 includes the power system connector 55a and the communication system connector 55b which are adjacent to each other. The instrument panel connection portion 56 includes the power system connector 56a and the communication system connector 56b which are adjacent to each other.

Each of the communication system connectors 54b, 55b and 56b on the JB switch box 31C is connected to the communication system connector 57b which is connected to the Ethernet communication line in the sub harness constituting the wire harness 57. Moreover, each of the power system connectors 54a, 55a and 56a on the JB switch box 31C is connected to the power system connector 57a which is connected to the electric wires other than the Ethernet communication line in the sub harness constituting the wire harness 57.

As shown in FIG. 4A, the wiring of the wire harness 57 can be facilitated by arranging the power system connector 54a and the communication system connector 54b to be adjacent to each other in the same engine compartment connection portion 54. That is, the two connectors (57a, 57b) of the sub harnesses, which are wired along a substantially common path from the inside of the engine room 11 to an installation position of the JB switch box 31C, can be routed together and fitted to the power system connector 54a and the communication system connector 54b at the same location.

Similarly as described above, the two connectors (57a, 57b) of the sub harnesses, which are wired along a substantially common path from the floor region in the vehicle compartment 12 to the installation position of the JB switch box 31C, can be routed together and fitted to the power system connector 55a and the communication system connector 55b at the same location. Moreover, the two connectors (57a, 57b) of the sub harnesses, which are wired along a substantially common path from the vicinity of the instrument panel in the vehicle compartment 12 to the installation position of the JB switch box 31C, can be routed together and fitted to the power system connector 56a and the communication system connector 56b at the same location.

As shown in FIG. 4B, in this example, a plurality of types of functions are mixed in the one single circuit substrate in the housing 51. The circuit substrate also includes the JB functional unit 52 and the switching hub functional unit 53. In the example of FIG. 4B, the JB functional unit 52 is provided in a region below the circuit substrate, and the switching hub functional unit 53 is provided in a region above the circuit substrate.

The communication system connectors 54b, 55b and the power system connectors 54a, 55a are provided on a right end side of the circuit substrate, while the communication system connector 56b and the power system connector 56a are provided on a left end side. In the example of FIG. 4B, since the plurality of types of functions are mixed in the one single circuit substrate, restrictions on arrangements of the power system connectors 54a, 55a, 56a, and the communication system connectors 54b, 55b, 56b are reduced.

<Circuit Configuration of JB Switch Box 31>

Figure 5:
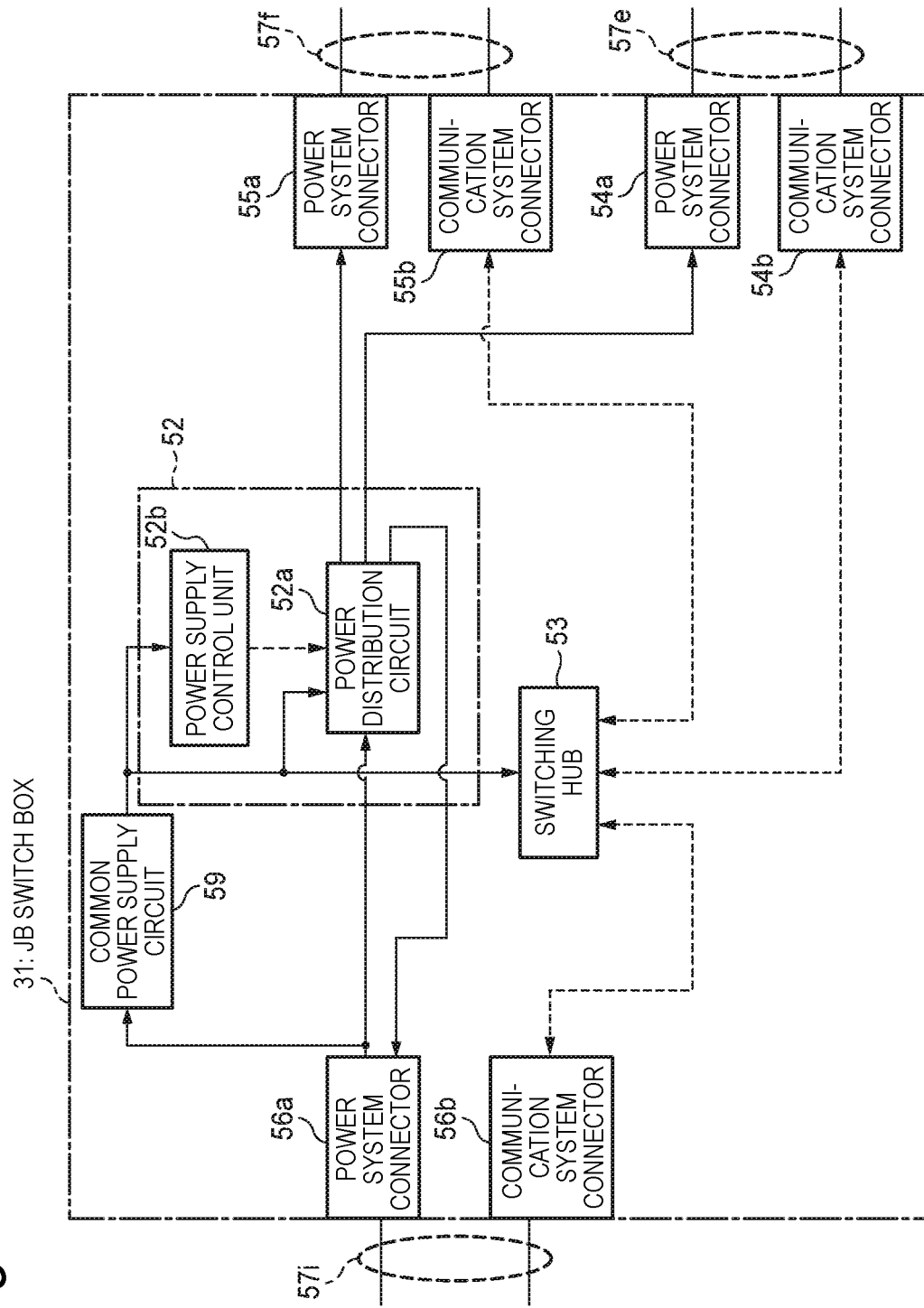
FIG. 5 is a block diagram showing a circuit configuration in the JB switch box of FIG. 2A.

FIG. 5 is a block diagram showing a circuit configuration in the JB switch box 31 of FIG. 2A. That is, circuit elements as shown in FIG. 5 are included in one or a plurality of circuit substrates in the housing 51.

The JB switch box 31 shown in FIG. 5 includes the JB functional unit 52, the switching hub functional unit 53, and a common power supply circuit 59. Moreover, the JB functional unit 52 includes a power distribution circuit 52a and a power supply control unit 52b.

The power distribution circuit 52a can supply power supply power supplied from an input side path in a state of being distributed to each output side path of a plurality of systems. For example, it is assumed that the power distribution circuit 52a uses a plurality of semiconductor switching elements to control on and off of energization for each path, supplies power only to a necessary path, and adjusts an amount of power to be distributed for each path by adjusting on and off duty or the like. The power supply control unit 52b appropriately controls the power distribution circuit 52a according to situations, and controls the amount of power to be distributed for each path.

In the example of FIG. 5, the JB functional unit 52 can receive power supply power supplied from the in-vehicle battery 9 via the power system connector 56a, distribute and supply the power supply power to output systems of the power system connectors 54a, 55a, 56a.

Similarly to a switching hub having a general configuration, the switching hub functional unit 53 can process each signal frame included in Ethernet communication, and control signal relay and path switching for each signal. For example, a frame of Ethernet communication input from the communication system connector 56b is relayed, and any one of paths of the communication system connectors 54b, 55b can be selected to send the frame thereto according to a destination of the communication. Moreover, the switching hub functional unit 53 can relay a frame of Ethernet communication input from the communication system connector 54b, and any one of paths of the communication system connectors 55b, 56b can be selected to send the frame thereto according to a destination of the communication.

Since the switching hub functional unit 53 itself does not include any power supply circuit, which is necessary for an operation thereof, it is necessary to supply predetermined power supply power with stable voltage from outside.

Meanwhile, the common power supply circuit 59 can generate stable output side power supply power which has a voltage (for example, +5 [V]) necessary for an operation of an electronic circuit in the JB switch box 31 based on input side power supply power supplied from a main power supply, such as the in-vehicle battery 19, via a +B power supply line and the power system connector 56a. The common power supply circuit 59 supplies the generated power supply power as common power supply power to each of the power distribution circuit 52a, the power supply control unit 52b, and the switching hub functional unit 53.

As shown in FIG. 5, when the JB functional unit 52 and the switching hub functional unit 53 are integrated in the housing 51 of the JB switch box 31, the JB functional unit 52 and the switching hub functional unit 53 can commonly use the power supply power supplied from the common power supply circuit 59. Therefore, as compared with a case where an independent switching hub is externally attached to the outside of the housing 51, the number of components of the entire circuit can be reduced, and a volume thereof can be reduced. Further, there is no need to provide a wire harness for connecting between the housing 51 and the externally attached switching hub. Therefore, a component cost can also be reduced.

A wire harness 57i connected to the power system connector 56a and the communication system connector 56b of the JB switch box 31 corresponds to the portion of the sub harness, which passes through the wiring path between the JB switch box 31 and the vicinity of the instrument panel, among the sub harnesses constituting the wire harness 57.

A wire harness 57e connected to the power system connector 54a and the communication system connector 54b of the JB switch box 31 corresponds to the portion of the sub harness, which passes through the wiring path between the JB switch box 31 and the inside of the engine room 11, among the sub harnesses constituting the wire harness 57.

A wire harness 57f connected to the power system connector 55a and the communication system connector 55b of the JB switch box 31 corresponds to the portion of the sub harness, which passes through the wiring path between the JB switch box 31 and the floor region in the vehicle compartment 12, among the sub harnesses constituting the wire harness 57.

<Outline 2 of Layout on Vehicle>

Figure 6:
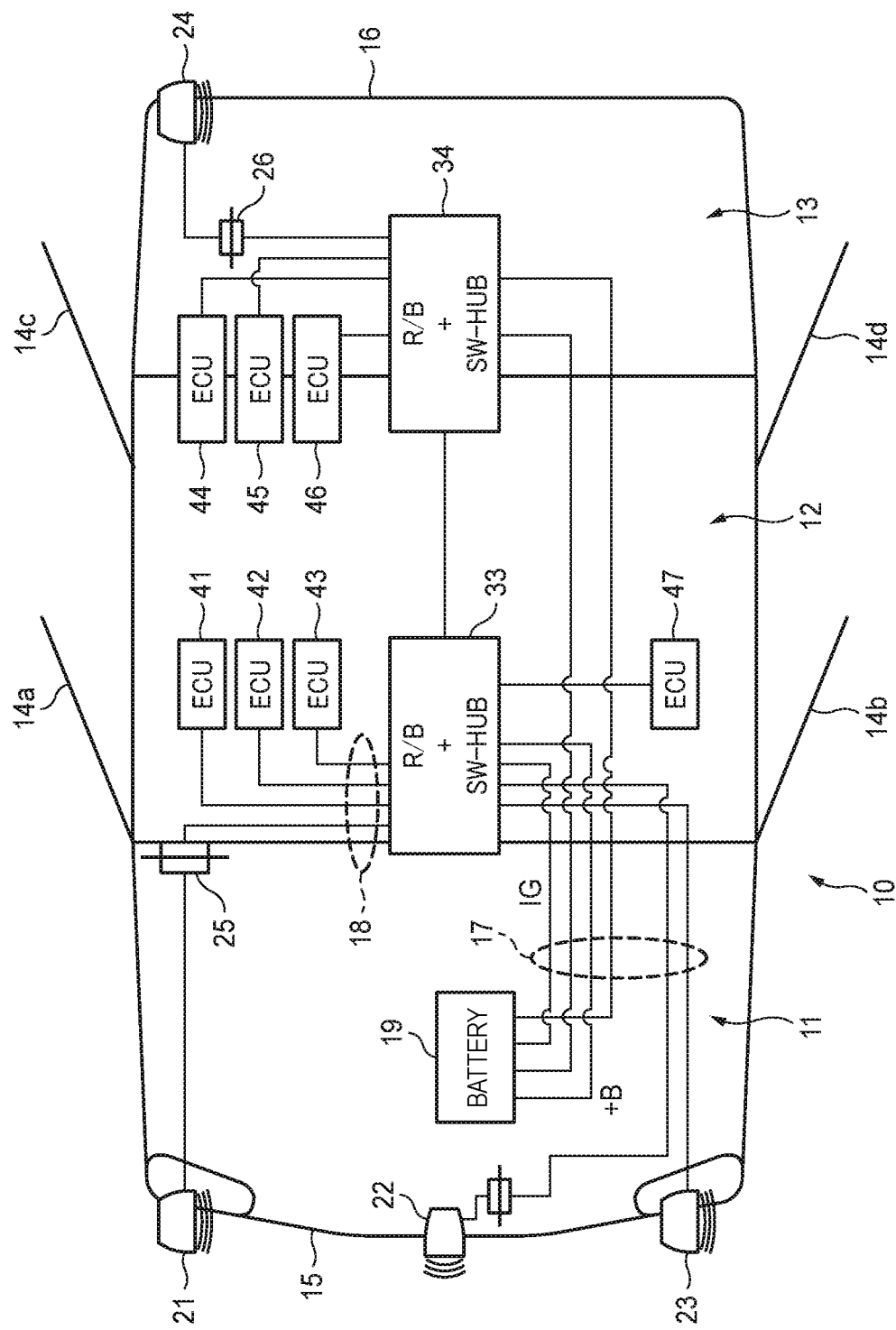
FIG. 6 is a plan view showing a layout outline of main components on a vehicle equipped with an electric connection box configured as an RB switch box.

FIG. 6 is a plan view showing a layout outline of main components on the vehicle 10 equipped with an electric connection box configured as RB switch boxes 33, 34. FIG. 6 is a plan view of main components on the vehicle 10 as viewed from above. A left side of the figure represents a front side of the vehicle while a right side represents a rear side.

The configuration shown in FIG. 6 is almost the same as the configuration of FIG. 1 except that the JB switch boxes 31, 32 are changed to the RB switch boxes 33, 34, and there are differences in actual installation positions and detail configurations as described below.

Each of the RB switch boxes 33 and 34 basically integrates a function of a relay box (R/B), which is a common component, and the function of the Ethernet communication switching hub, and is accommodated in one housing.

Therefore, communication lines can also be connected to the RB switch boxes 33 and 34 in addition to power supply lines of the wire harnesses 17, 18. Moreover, since the function of the relay box and the function of the switching hub are integrated in the one housing, power supply lines connecting such components are not required in the wire harnesses 17, 18.

<Appearance and Installation Position of RB Switch Box 33>

Figure 7A:
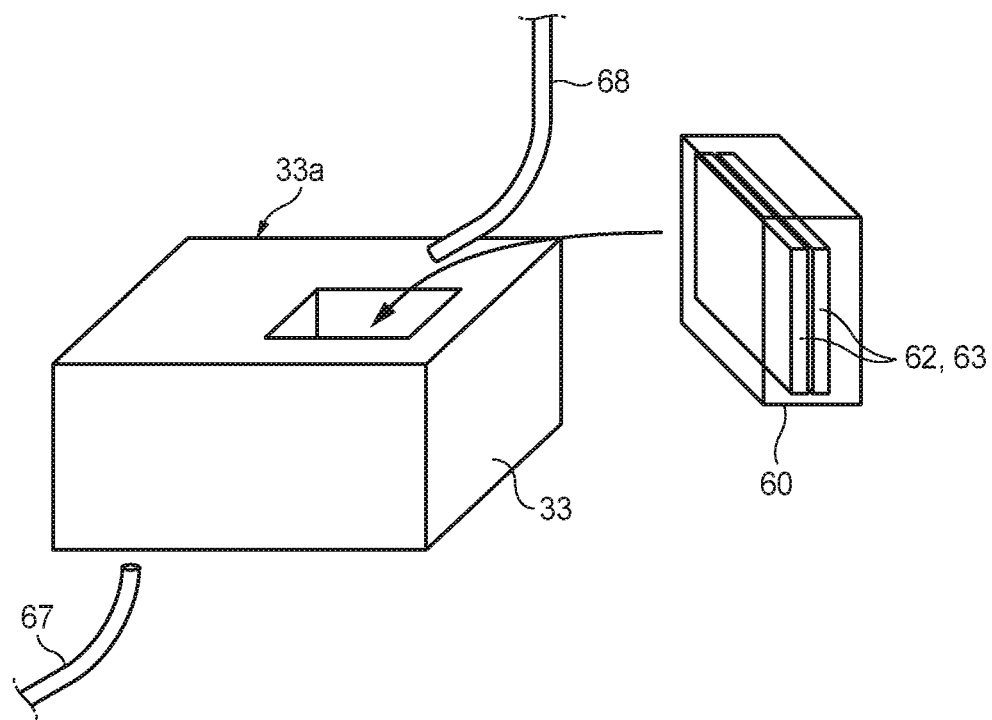
FIG. 7A is a perspective view showing an example of an appearance of the RB switch box.
Figure 7B:
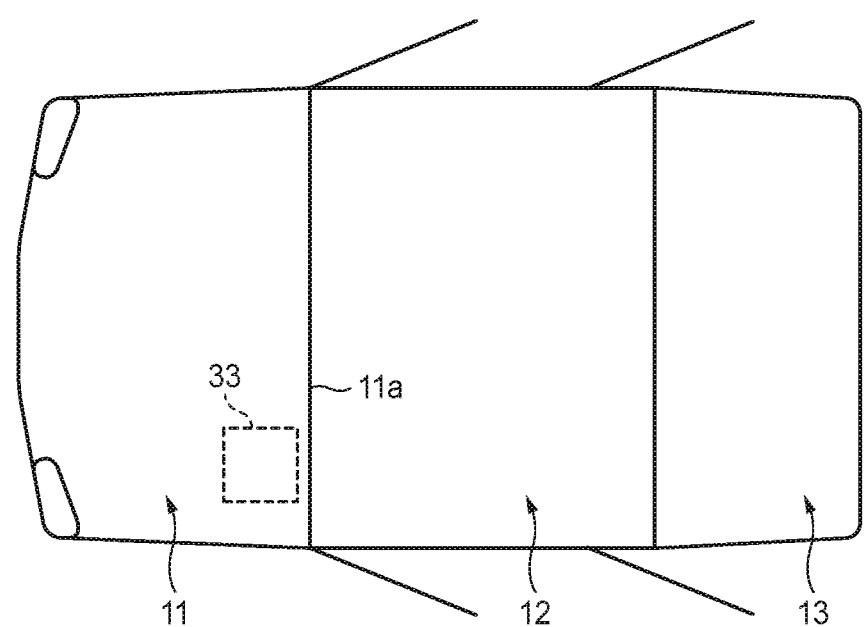
FIG. 7B is a plan view showing an arrangement example of the RB switch box on the vehicle.

FIG. 7A is a perspective view showing an example of an appearance of the RB switch box 33, and FIG. 7B is a plan view showing an arrangement example of the RB switch box 33 on the vehicle 10.

As shown in FIG. 7A, the RB switch box 33 includes a housing 33a which forms a hollow box having a rectangular parallelepiped outer shape. Moreover, a circuit substrate of a circuit unit 60, which includes an RB functional unit 62 and a switching hub functional unit 63, is accommodated in the housing 33a.

A wire harness 67 is connected to one end side of the RB switch box 33 while a wire harness 68 is connected to the other end side. One end of the wire harness 67 is connected to the RB switch box 33 while the other end thereof is connected to the in-vehicle battery 19. One end of the wire harness 68 is connected to the RB switch box 33 while the other end thereof is connected to another electric component, such as the RB switch box 34.

As shown in FIG. 7B, the RB switch box 33 is installed such that at least a portion of the housing 33a or a connector is located in a space in the engine room 11. Since various electric components in the engine room 11 are required to be waterproof, the housing 33a of the RB switch box 33 and an electric connection portion thereof (such as a connector) also have a waterproof function.

As shown in FIG. 7A, since the circuit unit 60 including the RB functional unit 62 and the switching hub functional unit 63 is accommodated in the housing 33a which has the waterproof function, the RB functional unit 62 and the switching hub functional unit 63 do not need any special waterproof function.

For example, as performance of the LiDAR devices 21 to 23 increases and as the number thereof increases, a diameter of a through hole is increased at a location where the wire harness, which includes a communication line for connecting the LiDAR devices 21 to 23, passes through a partition wall 11a of the engine room 11, and thus vibration and noise in the engine room 11 may be easily transmitted into the vehicle compartment 12.

However, when communication lines of the LiDAR devices 21 to 23 are directly connected to the RB switch box 33 in the engine room 11, a communication path switching function of the switching hub functional unit 63 in the RB switch box 33 can be used. As a result, the wire harness can be prevented from being enlarged at the location where the partition wall 11a is passed through, and the vibration and noise in the engine room 11 can be prevented from being transmitted into the vehicle compartment 12. Moreover, since distances between each of the LiDAR devices 21 to 23 and the RB switch box 33 can be reduced, there is no need to insert a relay connector in the middle of the wire harness to relay an Ethernet communication signal.

<Circuit Configuration of RB Switch Box 33>

Figure 8:
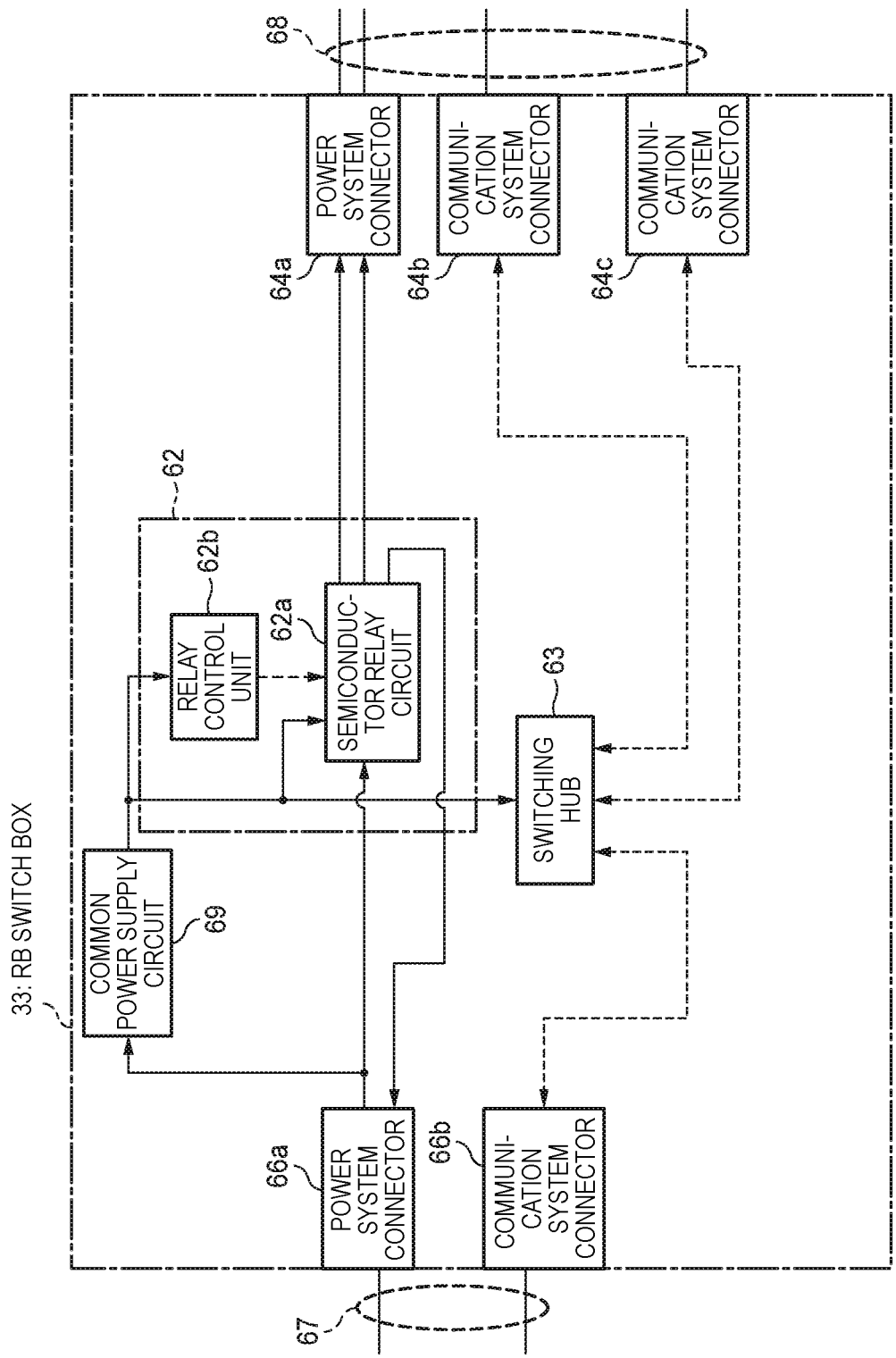
FIG. 8 is a block diagram showing a circuit configuration in the RB switch box of FIG. 7A.

FIG. 8 is a block diagram showing a circuit configuration in the RB switch box 33 of FIG. 7A. Circuit elements as shown in FIG. 8 are included in the circuit substrate of the circuit unit 60 in the housing 33a.

The RB switch box 33 shown in FIG. 8 includes the RB functional unit 62, the switching hub functional unit 63, and a common power supply circuit 69. The RB functional unit 62 includes a semiconductor relay circuit 62a and a relay control unit 62b.

The semiconductor relay circuit 62a uses a semiconductor switching element to turn on and off an operation of supplying power supply power supplied from an input side power supply line path to an output side power supply line. That is, the semiconductor relay circuit 62a is used to cut off an excessive current like a fuse so as to protect the power supply and each load. The relay control unit 62b monitors an energization state and the like of the semiconductor relay circuit 62a and generates a control signal to control on and off of the semiconductor relay circuit 62a.

In the example of FIG. 8, the RB functional unit 62 receives power supply power supplied from the in-vehicle battery 19 via a power system connector 66a. The power is supplied to a load side power supply line via the RB functional unit 62 and a power system connector 64a, When a power supply system abnormality occurs, the RB functional unit 62 automatically cuts off energization.

Similarly to a switching hub having a general configuration, the switching hub functional unit 63 can process each signal frame included in Ethernet communication, and control signal relay and path switching for each signal. For example, a frame of Ethernet communication input from the communication system connector 66b is relayed, and any one of paths of communication system connectors 64b, 64c can be selected to send the frame thereto according to a destination of the communication. Moreover, a frame of Ethernet communication input from the communication system connector 64b is relayed, and any one of paths of the communication system connectors 64c, 66b can be selected to send the frame thereto according to a destination of the communication.

Since the switching hub functional unit 63 itself does not include any power supply circuit, which is necessary for an operation thereof, it is necessary to supply predetermined power supply power with stable voltage from outside.

Meanwhile, the common power supply circuit 69 can generate stable output side power supply power which has a voltage (for example, +5 [V]) necessary for an operation of an electronic circuit in the RB switch box 33 based on input side power supply power supplied from a main power supply, such as the in-vehicle battery 9, via a +B power supply line and the power system connector 66a. The common power supply circuit 69 supplies the generated power supply power as common power supply power to each of the semiconductor relay circuit 62a, the relay control unit 62b, and the switching hub functional unit 63.

As shown in FIG. 8, when the RB functional unit 62 and the switching hub functional unit 63 are integrated in the housing 33a of the RB switch box 33, the RB functional unit 62 and the switching hub functional unit 63 can commonly use the power supply power supplied from the common power supply circuit 69. Therefore, as compared with a case where an independent switching hub is externally attached to the outside of the housing 33a, the number of components of the entire circuit can be reduced, and a volume thereof can be reduced. Further, there is no need to provide a wire harness for connecting between the housing 33a and the externally attached switching hub.

The wire harness 67 connected to the power system connector 66a of the RB switch box 33 corresponds to a portion of a sub harness, which passes through a wiring path between the RB switch box 33 in the engine room 11 and in-vehicle battery 9, among sub harnesses constituting the entire wire harness.

The wire harness 68 connected to the power system connector 64a and the communication system connectors 64b, 64c of the RB switch box 33 corresponds to a portion of a sub harness, which passes through a wiring path between the RB switch box 33 and another electric component, among sub harnesses constituting the entire wire harness.

For example, the JB switch box 31 shown in FIG. 1 and the RB switch box 33 shown in FIG. 6 may be placed on the same vehicle 10. In this case, it is assumed that the RB switch box 33 is provided in the engine room 11, and the JB switch box 31 is provided on the floor in the vehicle compartment 12.

In the configurations of FIGS. 1 and 6, although it is assumed that the power supply power is supplied from the in-vehicle battery 19 which serves as the main power supply toward the load side, it is also conceivable to use a sub battery in addition to the in-vehicle battery 19 or use other batteries distributed at various locations. In this case, an energization direction in which the power passes through the power supply line may be switched as necessary, or a backup power supply line may be added.

Features of the electric connection box according to the embodiment of the present invention are briefly summarized in the following [1] to [4].

[1] An electric connection box (the JB switch box 31 or the RB switch box 33), in which at least a power distribution circuit (52a), which is configured to distribute power supply power supplied from an input side power supply line to a plurality of output side power supply lines, and/or an electric component (the semiconductor relay circuit 62a), which is configured to perform a predetermined function with respect to the power supply power, are provided in a predetermined housing (51).

The electric connection box includes: a plurality of communication connectors (the communication system connectors 54b, 55b, 56b) provided on or in the housing;

a communication switch circuit (the switching hub functional unit 53), which is provided inside the housing, has a communication relay function and controls a communication path between the plurality of communication connectors; and a common power supply circuit (59), which is provided inside the housing and capable of supplying common power generated based on the power from the input side power supply line to a plurality of electric circuits including the communication switch circuit.

[2] The electric connection box (the JB switch box 31) according to [1] above, in which a plurality of output side power connectors (the power system connectors 54a, 55a), which are connectable to a plurality of power cables each having a different cabling path, are provided on or in the housing.

The plurality of communication connectors (the communication system connectors 54b, 55b) are respectively provided at positions adjacent to or close to the plurality of output side power connectors.

[3] The electric connection box (the RB switch box 33) according to [1] above, in which at least a portion of the housing is provided in a state of being exposed in an engine room (11) of a vehicle.

A portion of the plurality of communication connectors (the communication system connectors 66b, 64b, 64c) are provided in a state of being exposed in the engine room.

[4] The electric connection box according to [3] above, in which the housing (33a) has a waterproof function.

The communication switch circuit (the switching hub functional unit 63) and the common power supply circuit (69) share the waterproof function of the housing with the electric component (the RB functional unit 62).

What is claimed is:

1. An electric connection box, wherein at least a power distribution circuit, which is configured to distribute power supply power supplied from an input side power supply line to a plurality of output side power supply lines, and/or an electric component, which is configured to perform a predetermined function with respect to the power supply power, are provided in a predetermined housing, the electric connection box comprising:
a plurality of communication connectors provided on or in the housing;
a communication switch circuit, which is provided inside the housing, has a communication relay function and controls a communication path between the plurality of communication connectors; and
a common power supply circuit, which is provided inside the housing and capable of supplying common power generated based on the power from the input side power supply line to a plurality of electric circuits including the communication switch circuit.

2. The electric connection box according to claim 1, wherein a plurality of output side power connectors, which are connectable to a plurality of power cables each having a different cabling path, are provided on or in the housing, and
the plurality of communication connectors are respectively provided at positions adjacent to or close to the plurality of output side power connectors.

3. The electric connection box according to claim 1, wherein at least a portion of the housing is provided in a state of being exposed in an engine room of a vehicle, and
a portion of the plurality of communication connectors are provided in a state of being exposed in the engine room.

4. The electric connection box according to claim 3, wherein the housing has a waterproof function, and
the communication switch circuit and the common power supply circuit share the waterproof function of the housing with the electric component.

* * * * *